(12) United States Patent
Hsu et al.

(10) Patent No.: US 6,617,637 B1
(45) Date of Patent: Sep. 9, 2003

(54) ELECTRICALLY ERASABLE PROGRAMMABLE LOGIC DEVICE

(75) Inventors: Ching-Hsiang Hsu, Hsin-Chu (TW); Yen-Tai Lin, Hsin-Chu (TW); Chih-Hsun Chu, Hsin-Chu (TW); Shih-Jye Shen, Hsin-Chu (TW); Ching-Sung Yang, Chang-Hua Hsien (TW); Ming-Chou Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/065,718

(22) Filed: Nov. 13, 2002

(51) Int. Cl.[7] .......................... H01L 29/76; H01L 29/788
(52) U.S. Cl. ........................................ 257/315; 257/318
(58) Field of Search .................................. 257/315, 318

(56) References Cited

U.S. PATENT DOCUMENTS 6,512,700 B1 * 1/2003 McPartland et al.
6,545,311 B2 * 4/2003 Shukuri et al.
6,570,212 B1 * 5/2003 Mehta et al.

FOREIGN PATENT DOCUMENTS

EP        0612107        * 2/1993

* cited by examiner

Primary Examiner—Stephen D. Meier
(74) Attorney, Agent, or Firm—Winston Hsu

(57) ABSTRACT

An electrically erasable programmable logic device (EEPLD) includes a P type semiconductor substrate. An N type well is formed on the P type semiconductor substrate. A first PMOS transistor is formed on the N well. The first PMOS transistor comprises a floating gate, a first P[+] doped region serving as a drain of the first PMOS transistor, and a P[−] doped region encompassing an N[+] doped region for erasing the first PMOS transistor. A second PMOS transistor is also formed on the N well and serially connected to the first PMOS transistor. The first P[+] doped region functions as a source of the second PMOS transistor, and the second PMOS transistor further comprises a select gate and a second P[+] doped region serving as a drain of the second PMOS transistor.

33 Claims, 5 Drawing Sheets

//ELECTRICALLY ERASABLE
ELECTRICALLY ERASABLE PROGRAMMABLE LOGIC DEVICE

BACKGROUND OF INVENTION

1. Field of the Invention

The present invention relates to a semiconductor device and related operation method. More particularly, the present invention relates to a single-poly electrically erasable programmable logic device (EEPLD) capable of implementing low-voltage data writing through a channel hot electron injection (CHEI) mechanism. The single-poly EEPROM according to this invention, which is compatible with standard CMOS fabrication processes and is thus suited for system-on-a-chip (SOC) field, has the advantages of low power consumption, high write/erase efficiency, and high packing density.

2. Description of the Prior Art

Electronic memory comes in a variety of forms to serve a variety of purposes.

Flash electrically erasable programmable read only memory (flash EEPROM) is used for easy and fast information storage in such devices as personal digital assistants (PDA), digital cameras and home video game consoles. Generally, an EEPROM chip has a grid of columns and rows with a cell that has two transistors at each intersection. One of the transistors is known as a floating gate, and the other one is the control gate. The floating gate's only link to the row, or word line, is through the control gate. As long as this link is in place, the cell has a value of 1. Changing the value to a 0 requires a well-known process called Fowler-Nordheimtunneling. It is often desirable to combine many functions on a single device, also referred to as system-on-a-chip (SOC), to reduce the number and cost of chips. Embedding flash memory in a CMOS device allows a single chip produced by a manufacturer to be configured for a variety of applications, and/or allows a single device to be configured by a user for different applications. To combine with standard CMOS process flow, single-poly flash memory devices have been developed.

FIG. 1 is a schematic, cross-sectional view of a prior art single-poly EEPLD cell 10. As shown in FIG. 1, the EEPLD cell 10 comprises an NMOS structure 28 and a PMOS structure 30. A field oxide layer 24 isolates the PMOS structure 30 from the NMOS structure 28.The NMOS, structure 28 is formed on a P-type substrate 12 and comprises an NMOS gate 32, an N$^+$ source region 14, and an N$^+$ drain region 16. The PMOS structure 30 is formed on an N-well 18 and comprises a PMOS floating gate 34, a P$^+$ source region 20, and a P$^+$ drain region 22. A channel stop region 38 is obliquely implanted underneath the PMOS floating gate 34 for facilitating band-to-band hot electron injection into the PMOS floating gate. A conductor 36 directly electrically couples the NMOS gate 32 to the PMOS floating gate 34. That is, there is a conductive current path from one gate to the other, as opposed to indirectly coupling, such as capacitively coupling. Both gates 32 and 34 are floating, that is, they are not directly electrically coupled to a voltage or current source or sink on the IC, and are at the same electrical potential. The conductor may be a polysilicon trace formed at the same time as the gates, or may be a metal or silicide conductor formed later in the fabrication sequence.

However, the above described prior art EEPLD cell 10 suffers from several drawbacks. First, the prior art EEPLD cell 10 consumes a lot of chip area since it is composed of a PMOS structure 30 and a NMOS structure 28, and the extra field oxide layer 24 is needed for isolating the PMOS 30 form the NMOS 28. Second, the prior art EEPLD cell 10 needs an extra channel stop region 38 and formation of conductor 36 for connecting two gates. This, in turns, means extra process steps and thus raised cost.

SUMMARY OF INVENTION

Accordingly, it is a primary object of the claimed invention to provide a high-density single-poly memory device that consumes small per unit chip area. The single-poly memory device according to this invention can be operated under a relatively low voltage Thus, a low power consumption flash memory can be obtained.

It is another object of the claimed invention to provide a high-density single-poly EEPROM device which is power saving and can be fabricated with conventional CMOS process sequences.

According to the claimed invention, an electrically erasable programmable logic device (EEPLD) is disposed in a P type semiconductor substrate. An N type well is formed on the P type semiconductor substrate. A first PMOS transistor is formed on the N well. The first PMOS transistor comprises a floating gate, a first P$^+$ doped region serving as a drain of the first PMOS transistor, and a P$^-$ doped region, which serves as a source of the first PMOS transistor, encompassing an N$^+$ doped region for erasing the first PMOS transistor. A second PMOS transistor is also formed on the N well and serially connected to the first PMOS transistor. The first P$^+$ doped region functions as a source of the second PMOS transistor, and the second PMOS transistor further comprises a select gate and a second P$^+$ doped region serving as a drain of the second PMOS transistor. The EEPLD according to this invention utilizes channel hot electron injection to carry out a data write operation, while using a Band-to-Band tunneling hot hole injection to carry out a data erase operation.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
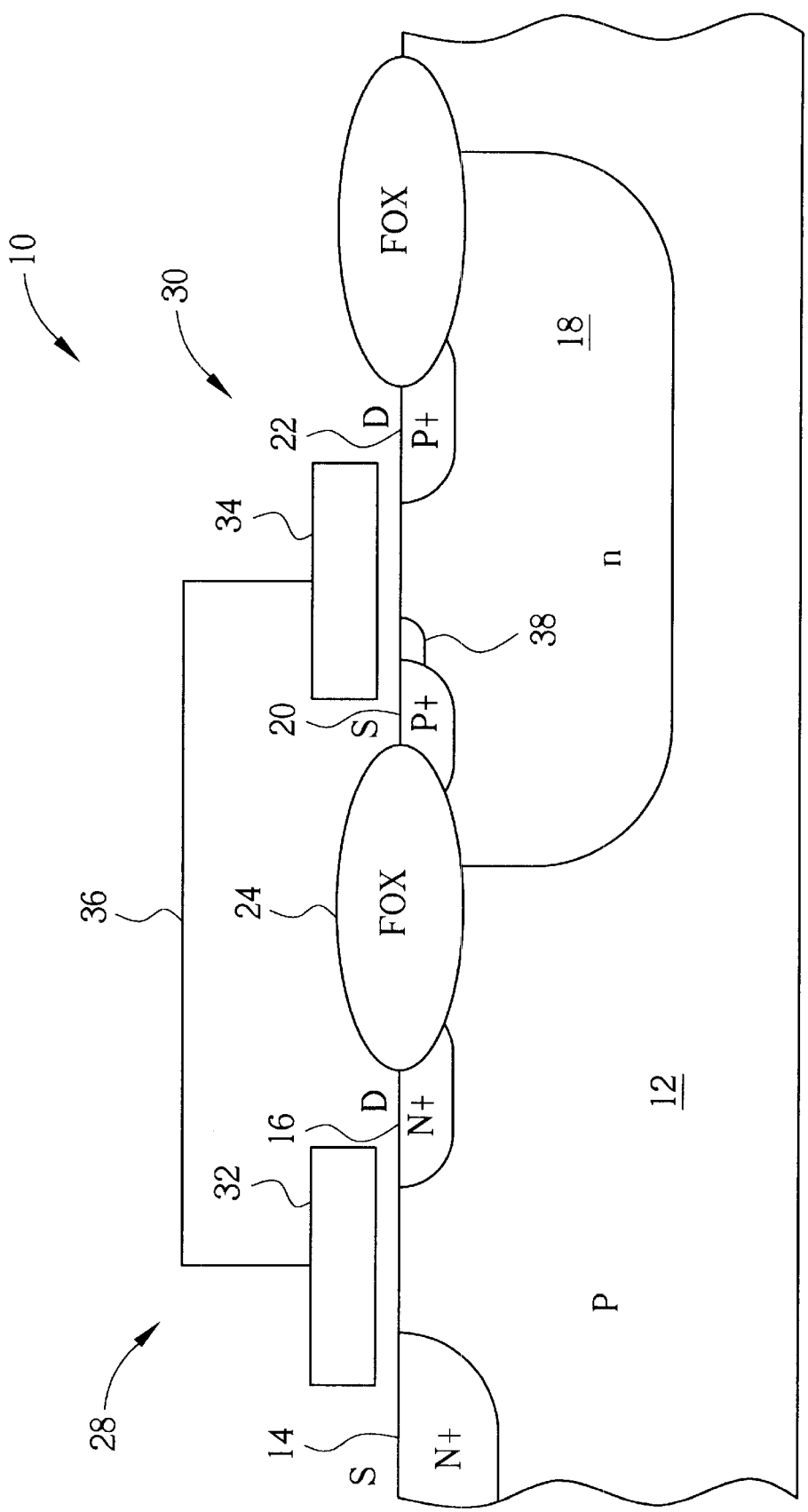
FIG. 1 is a simplified cross section of an EEPLD cell according to the prior art.
Figure 2:
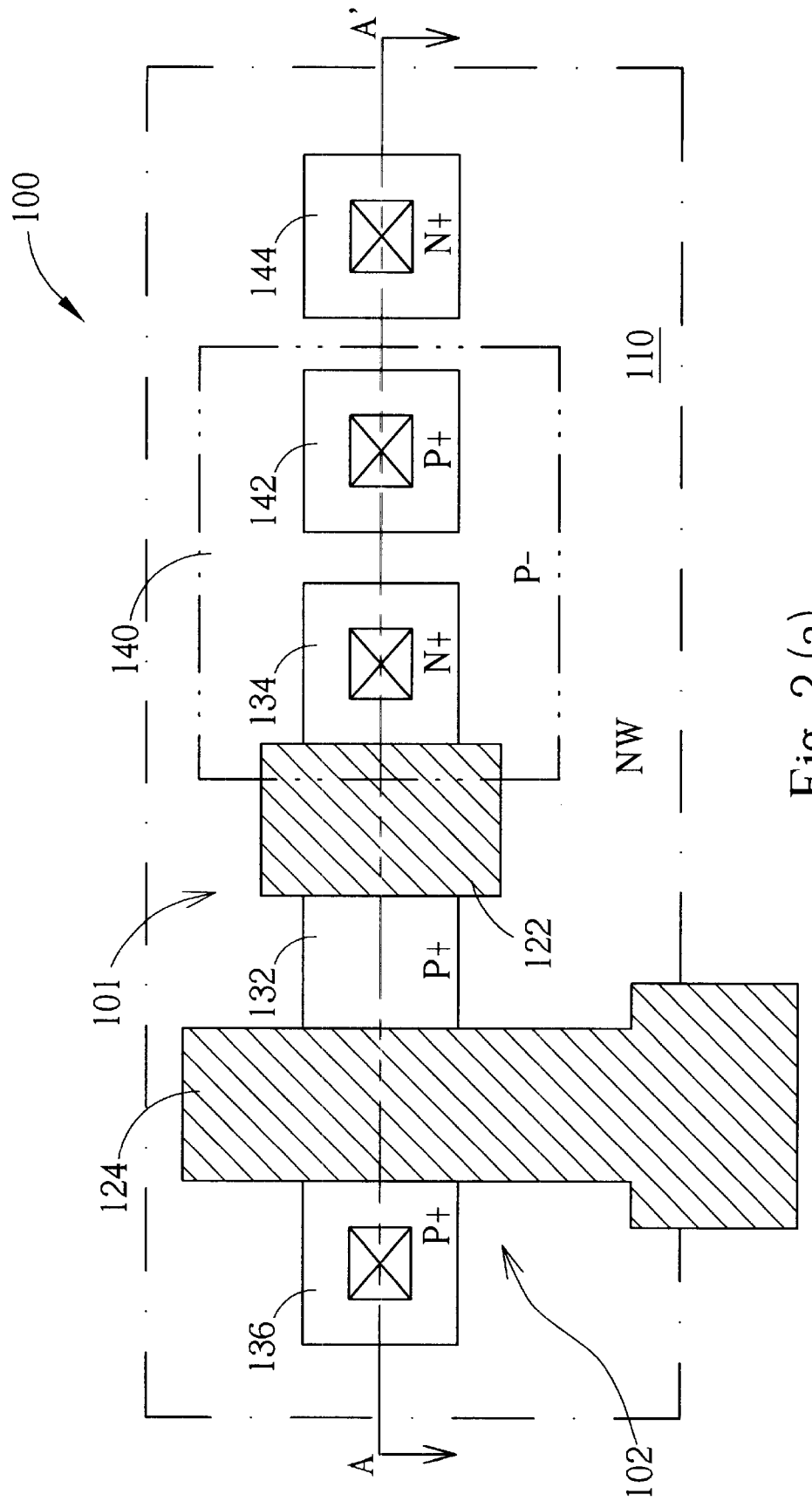
FIG. 2(a) is a plane view schematically illustrating a partial layout of the EEPLD according to one preferred embodiment of this invention.
FIG. 2(b) is a schematic cross-sectional view of the EEPLD of FIG. 2(a) along line AA".
Figure 2:
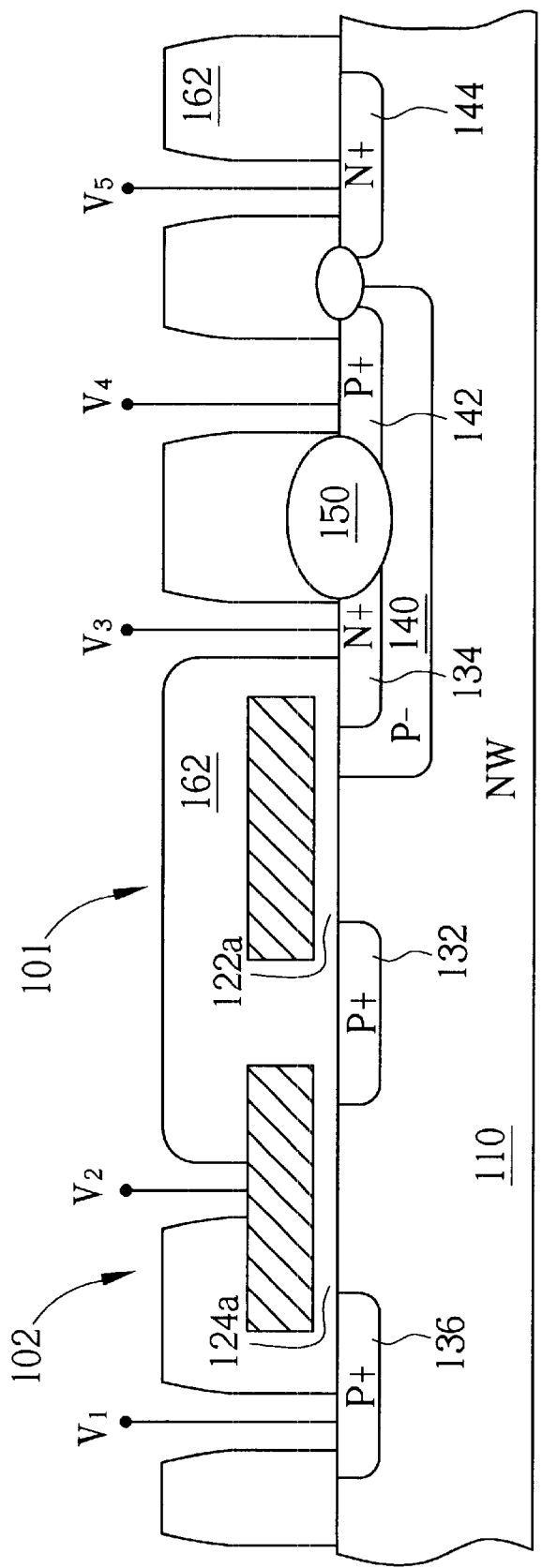

The preferred embodiment in accordance with the present invention will be discussed in detail with reference to FIG. 2(a) to FIG. 6. It is understood that the type of semiconductor regions, device layout, and polarity of voltages are chosen solely for illustration, and person having ordinary skill in the art would recognize other alternatives, variations, and modifications.

Please refer to FIG. 2(a) and FIG. 2(b). FIG. 2(a) is a plane view schematically illustrating a partial layout of the EEPLD 100 according to one preferred embodiment of this invention. FIG. 2(b) is a schematic cross-sectional view of the EEPLD 100 of FIG. 2(a) along line AA". As shown in FIG. 2(a), a single-poly EEPLD unit 100 comprises a PMOS transistor 101 and a PMOS transistor 102 serially connected to the PMOS transistor 101. The PMOS transistor 101 and the PMOS transistor 102 are formed on an N-well 110. The PMOS transistor 101, which is a floating gate transistor, comprises a floating gate 122, a P+ doped drain region 132 at one side of the floating gate 122, and an N+ doped region 134 at the opposite side of the floating gate 122. The floating gate 122 is formed only on the N-well region and not formed over any field oxide layer region that has P-type and a dopant concentration greater than a dopant concentration of the well region. The N+ doped region 134, which is formed within a P+ doped region 140, is primarily used to erase data stored in the floating gate 122. As specifically indicated in FIG. 2(a), the P+ doped region 140 partially overlaps with the overlying floating gate 122, which may be done by using oblique ion implantation or thermal drive-in technique known in the art. It is understood that the floating gate 122 consists of a single layer polysilicon according to the present invention, that is, there is no word line or control electrode stacked thereon. A P+ doped region 142, through which a source line voltage is applied to the subjacent P− doped region 140, is formed within the P− doped region 140 and is isolated from the adjacent N+doped region 134 with an field oxide layer 150 or the like. By commonly using the P+ doped region 132, the PMOS transistors 101 and 102 are serially connected to each other. The PMOS transistor 102 comprises a select gate 124, the P+ doped region 132, and a P+ doped region 136. The select gate 124 is electrically connected to a word line (not explicitly shown). The P+ doped region 132 functions as a drain of the PMOS transistor 101 and also a source of the PMOS transistor 102. In one case, a salicide layer may be optionally formed on the P doped region 142, the N+ doped region 134, and the P+ doped region 136.

In FIG. 2(b), the PMOS transistor 101 further comprises a floating gate oxide layer 122a interposed between the floating gate 122 and the substrate. The PMOS transistor 102 further comprises a gate oxide layer 124a underneath the select gate thereof. The P+ doped region 136 of the PMOS transistor 102 is electrically connected with a bit line through a contact plug formed in an inter layer dielectric (ILD) film 162 for providing the EEPLD unit 100 with a bit line voltage ($V_1$). The bit line is typically defined over the dielectric film 162. In the preferred embodiment of the present invention, since the EEPLD unit 100 is operated at low operation voltages, the thickness of the floating oxide layer 122a, the thickness of the gate oxide layer 124a, and the thickness of gate oxide layer fabricated in a logic circuit area are the same. However, extra thermal processes may be carried out to increase the thickness of the floating gate oxide layer 122a or the thickness of the gate oxide layer 124a. In either case, the simplified EEPROM device of this invention can be combined with standard CMOS semiconductor processes.

Figure 3:
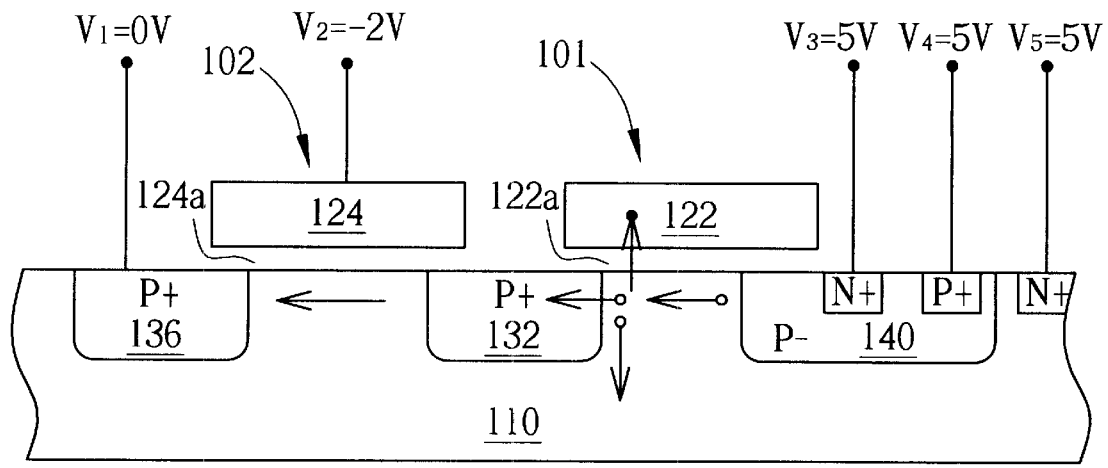
FIG. 3 is a cross-sectional diagram schematically illustrating the writing operation on a selected EERLD unit according to one preferred embodiment of this invention.

Please refer to FIG. 3. FIG. 3 is a cross-sectional diagram schematically demonstrating the writing operation on a selected EERLD unit according to one preferred embodiment of this invention. As shown in FIG. 3, by way of example, in a data write operation, a bit line voltage $V_1$ of 0V is applied to the P+ doped drain region of the PMOS transistor 102. A word line voltage $V_2$, which is preferably a voltage value lower than the bit line voltage $V_1$ by at least one threshold voltage ($V_{TH}$) in magnitude, for example, $V_2$=−2V, is applied to the select gate 124 of the PMOS transistor 102, thereby conducting a P channel thereof. Once the P channel under the select gate 124 is conducted, the P+ doped drain region 136 and the P+ doped region 132 are in a condition of the same voltage level, that is, 0V, according to the preferred embodiment. A well voltage $V_5$ of 5V is applied to the N well 110. The floating gate 122 of the PMOS transistor 101 is kept in a floating status. To keep the P− doped region 140 at a voltage level same as the N well 110, an erase voltage $V_3$ of 5V and a source line voltage $V_4$ of 5V are applied to the N+ doped region 134 and the P+ doped region 142, respectively, within the P− doped region 140. Under the above described conditions, a coupling voltage of about 3~4V will be induced at the floating gate 122 due to capacitive coupling effect, thereby turning on a P channel under the floating gate 122. Hot carriers such as electrons created by collisions are accelerated by electric field of a depletion region and surmount the energy barrier of the floating gate oxide layer 122a and are finally trapped inside the floating gate 122.

Figure 4:
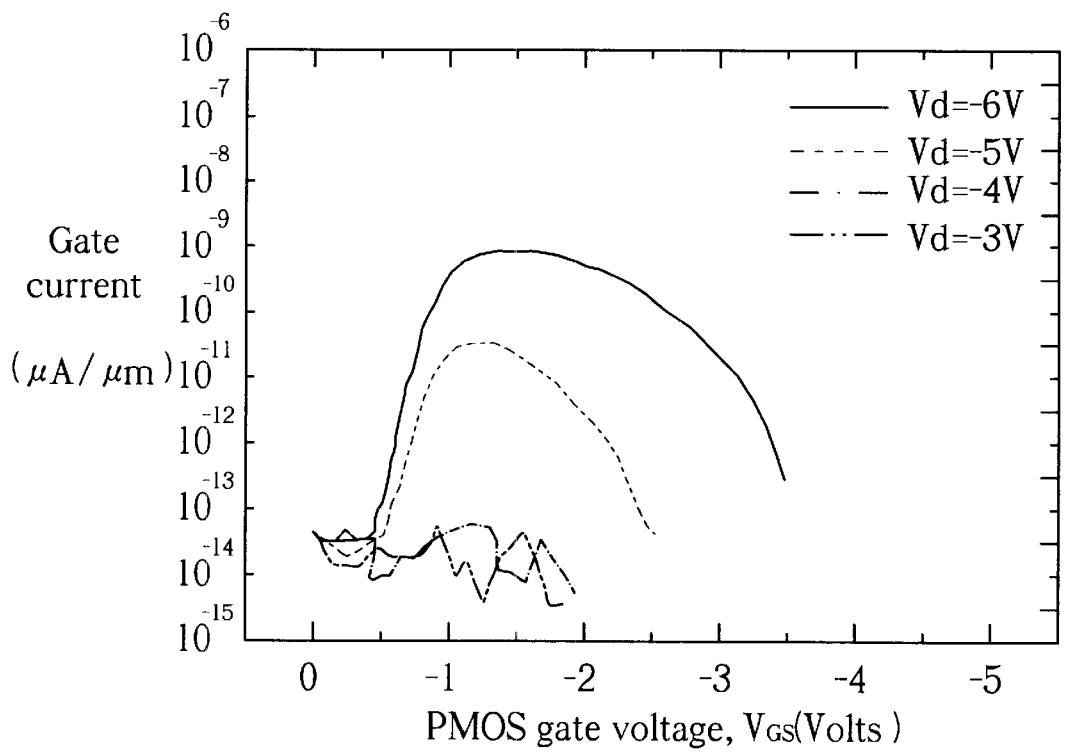
FIG. 4 plots the gate currents versus gate voltages of the floating gate regarding a PMOS transistor at different drain to N-well biases ($V_d = V_1 - V_5$).

Please refer to FIG. 4 with reference to FIG. 3, where FIG. 4 plots the gate currents versus gate voltages of the PMOS at different drain to N-well 110 biases ($V_d=V_1-V_5$). As shown in FIG. 4 at a drain voltage bias $V_d$=−5V, for example, the PMOS gate 122 acquires a relatively low-level coupling voltage of about −1~−2V. At the same time, the P channel is just turned on and reaches a gate current approaching a maximum value of about $5\times10^{-11} \mu A/\mu m$. In other words, it is clear that a better performance during the writing operation can be achieved according to the present invention, since the gate current to drain current ratio ($I_g/I_g$) is improved.

Figure 5:
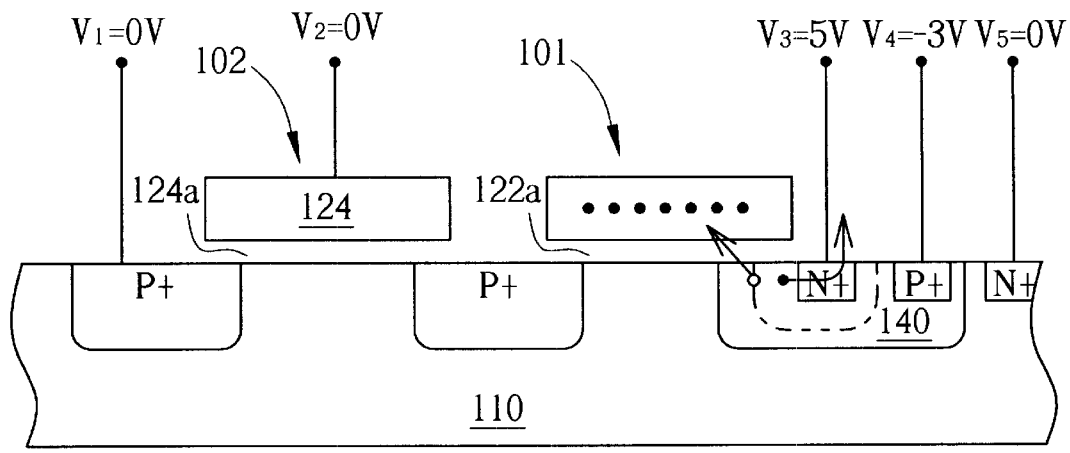
FIG. 5 is a cross-sectional diagram schematically.illustrating an erase operation on a selected EERLD unit according to one preferred embodiment of this invention.

Please refer to FIG. 5. FIG. 5 is a cross-sectional diagram schematically demonstrating the data erase operation on an EERLD unit according to one preferred embodiment of this invention. As shown in FIG. 5, by way of example, in a data erase operation, a bit line voltage $V_1$ of 0V is applied to the P+ doped drain region 136 of the PMOS transistor 102. A word line voltage $V_2$ of 0V is applied to the select gate 124 of the PMOS transistor 102 to turn off the P channel thereof. A well voltage $V_5$ of 0V is applied to the N well 110. The floating gate 122 of the PMOS transistor 101 is kept in a floating status. An erase voltage $V_3$ of 5V and a source line voltage $V_4$ of −3V are applied to the N+ doped region 134 and the P+ doped region 142, respectively. Under the above-described voltage conditions, a depletion region is generated due to the bias between the N+ doped region 134 and the P+ doped region 142. Holes of the electron-hole pairs created in the depletion region may gain sufficient energy to overcome the energy barrier of the floating gate oxide 122a and thus tunnel into the floating gate 122 by a so-called Band-to-Band tunneling (BTBT) mechanism, and thereby neutralizing the electrons trapped in the floating gate 122.

Figure 6:
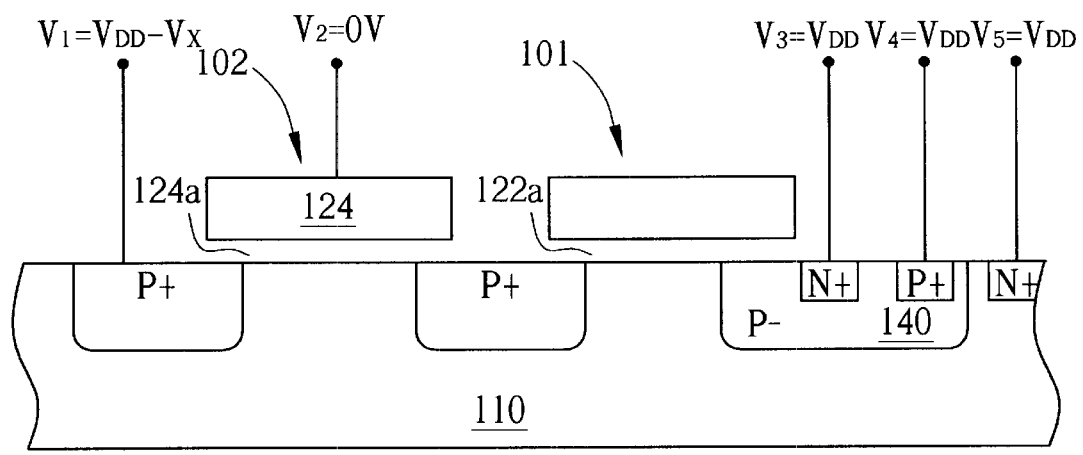
FIG. 6 is a cross-sectional diagram schematically illustrating a read operation on a selected EERLD unit according to one preferred embodiment of this invention.

Please refer to FIG. 6. FIG. 6 is a cross-sectional diagram schematically demonstrating the data read operation on an EERLD unit according to one preferred embodiment of this invention. As shown in FIG. 6, in a data read operation, a bit line voltage $V_1=V_{DD}-V_X$ (where $V_X$ is a bit line to source line cross voltage of a value that is greater than 0V) is applied to the P+ doped drain region 136 of the PMOS transistor 102. A word line voltage $V_2$ of 0V is applied to the select gate 124 of the PMOS transistor 102 to turn on the P channel thereof. A well voltage $V_5=V_{DD}$ is applied to the N well 110. The floating gate 122 of the PMOS transistor 101 is kept in a floating status. An erase voltage $V_3=V_{DD}$ and a source line voltage $V_4=V_{DD}$ are applied to the N+ doped region 134 and the P+ doped region 142, respectively.

To sum up, the EEPLD of the present invention can be operated at low voltages and can thus achieve the goal of saving energy. The unique design allows a greater gate current to drain current ratio ($I_g/I_d$) which means improved performance, higher data writing efficiency, and lower power dissipation. A gate current ($I_g$) approaching a maximum current is achieved right on the opening or turning on of the PMOS transistor. The N+ doped region 134, which allows the EEPLD unit to carry out efficient BTBT data erase operations, is also unique. Further, the serially connected PMOS transistors save a great deal of valuable chip area. Moreover, the single-poly EEPROM structure according to the present invention is capable of being combined with standard CMOS fabrication processes and is particularly suited for SOC fields.

Those skilled in the art will readily observe that numerous modification and alterations of the device may be made while retaining the teachings of the invention. For example, the electrically erasable programmable logic device may be configured as a Multiple Time Programming (MTP) memory device, an element of a capacitor trimming circuit, an element of a resistor trimming circuit, an element of a memory redundancy circuit, or an element of an electrical fuse circuit. Accordingly, the above disclosure should be construed as limited only by the metes and bounds of the appended claims.

What is claimed is:

1. An electrically erasable programmable logic device (EEPLD) formed in a semiconductor substrate, the EEPLD having an individual word line, a bit line, a source line, an erase line and a well contact, the EEPLD comprising:
    a second conductivity type well disposed in the semiconductor substrate, the well being electrically connected to the well contact;
    a first source region of a first conductivity type formed in the well region, the first source region being electrically connected to the source line;
    an erase region of the second conductivity type formed in the first source region, the erase region being electrically connected to the erase line;
    a first drain region of the first conductivity type formed in the well region;
    a first channel region defined between the first drain region and the erase region;
    a floating gate formed over the first channel region;
    a second source region of the first conductivity type formed in the well region;
    a second drain region of the first conductivity type formed in the well region, the second drain region being electrically connected to the bit line;
    a second channel region defined between the second source region and the second drain region; and
    a gate formed over the second channel region, the gate being electrically connected to the word line.

2. The electrically erasable programmable logic device of claim 1 wherein the floating gate and the gate are substantially in the same plane.

3. The electrically erasable programmable logic device of claim 1 wherein the first drain region and the second source region are merged into a contiguous region.

4. The electrically erasable programmable logic device of claim 1 acts as an element of a memory array.

5. The electrically erasable programmable logic device of claim 1 wherein the second conductivity type is N-type.

6. The electrically erasable programmable logic device of claim 1 wherein, in operation, a bit line voltage $V_1$, a word line voltage $V_2$, a source line voltage $V_3$, well voltage $V_4$ and a erase line voltage $V_5$ are applied on the electrically erasable programmable logic device, the floating gate is induced a voltage due to capacitive coupling effect, thereby causing channel carriers injected into floating gate region due to channel electric field.

7. The electrically erasable programmable logic device of claim 6 wherein $V_1$ is 0V or a negative voltage.

8. The electrically erasable programmable logic device of claim 6 wherein $V_2$ is a negative voltage, the negative voltage being larger than $V_1$ in magnitude.

9. The electrically erasable programmable logic device of claim 6 wherein $V_3$ ranges from 5V to 10V.

10. The electrically erasable programmable logic device of claim 6 wherein $V_4$ ranges from 5V to 10V.

11. The electrically erasable programmable logic device of claim 6 wherein $V_5$ ranges from 5V to 10V.

12. The electrically erasable programmable logic device of claim 6 wherein the operation is a programming operation.

13. The electrically erasable programmable logic device of claim 1 wherein when applying a bit line voltage $V_1''$, a word line voltage $V_2''$, a source line voltage $V_3''$, well voltage $V_4''$ and a erase line voltage $V_5''$ on the electrically erasable programmable logic device, a junction of the erase region and the first source line region under the floating gate is induced a reverse voltage and thereby induces hole injection into the floating gate.

14. The electrically erasable programmable logic device of claim 13 wherein $V_1''$ is 0V.

15. The electrically erasable programmable logic device of claim 13 wherein $V_2''$ is 0V.

16. The electrically erasable programmable logic device of claim 13 wherein $V_3''$ is -2V~-8V.

17. The electrically erasable programmable logic device of claim 13 wherein $V_4''$ is 0V.

18. The electrically erasable programmable logic device of claim 13 wherein V5 is 3V~8V.

19. The electrically erasable programmable logic device of claim 13 wherein the operation is an erase operation.

20. An electrically erasable programmable logic device (EEPLD) formed in a semiconductor substrate, the EEPLD comprising:
    a second conductivity type well disposed in the semiconductor substrate;
    a first source region of the first conductivity type formed in the well region;
    an erase region of the second conductivity type formed in the first source region;
    a first drain region of the first conductivity type formed in the well region;
    a first channel region defined between the first drain region and erase region;

a floating gate formed over the first channel region;

a second source region of the first conductivity type formed in the well region, the second source region being electrically connected with the first drain region;

a second drain region of the first conductivity type formed in the well region;

a second channel region defined between the second source region and the second drain region; and a gate formed over the second channel region.

21. The electrically erasable programmable logic device of claim 20 wherein the floating gate is electrically isolated.

22. The electrically erasable programmable logic device of claim 20 wherein the second conductivity type is N-type.

23. The electrically erasable programmable logic device of claim 20 acts as an element of a memory array.

24. The memory array of claim 23 comprising:

a plurality of the electrically erasable programmable logic devices arranged in rows and columns, each of the electrically erasable programmable logic devices being formed in the semiconductor substrate;

a plurality of word lines, each of the word lines being connected to each gate in a row of the electrically erasable programmable logic devices;

a plurality of bit lines, each of the bit lines being electrically connected to each of the second drain regions in a column of the electrically erasable programmable logic devices;

a plurality of source lines, each of the source lines being electrically connected to each of the first source regions in a row of the electrically erasable programmable logic devices; and a plurality of erase lines, each of the erase lines being electrically connected to each of the erase regions.

25. The memory array of claim 24 wherein the source lines are electrically connected to each other.

26. A memory array comprising:

a plurality of electrically erasable programmable logic devices arranged in rows and columns, each of the electrically erasable programmable logic devices being formed in a semiconductor substrate, and comprising:

a second conductivity type well disposed in the semiconductor substrate, the well being electrically connected to a well contact;

a first source region of the first conductivity type formed in the well region, the first source region being electrically connected to a source line;

an erase region of the second conductivity type formed in the first source region, the erase region being electrically connected to an erase line;

a first drain region of the first conductivity type formed in the well region;

a first channel region defined between the first drain region and erase region;

a floating gate formed over the first channel region;

a second source region of the first conductivity type formed in the well region;

a second drain region of the first conductivity type formed in the well region, the second drain region being electrically connected to a bit line;

a second channel region defined between the second source region and the second drain region; and a gate formed over the second channel region, the gate being electrically connected to a word line;

a plurality of the word lines, each of the word lines being connected to each gate in a row of the electrically erasable programmable logic devices;

a plurality of the bit lines, each of the bit lines being electrically connected to each second drain region in a column of the electrically erasable programmable logic devices:

a plurality of the source lines, each of the source lines being electrically connected to each first source region in a row of the electrically erasable programmable logic devices; and a plurality of the erase lines, each of the erase lines being electrically connected to each erase region.

27. The memory array of claim 26 wherein the first drain region and the second source region are merged into a contiguous region.

28. The memory array of claim 26 wherein the floating gate is electrically isolated.

29. The memory array of claim 26 wherein the electrically erasable programmable logic device is configured as a Multiple Time Programming (MTP) memory device.

30. The memory array of claim 26 wherein the electrically erasable programmable logic device is configured as an element of a capacitor trimming circuit.

31. The memory array of claim 26 wherein the electrically erasable programmable logic device is configured as an element of a resistor trimming circuit.

32. The memory array of claim 26 wherein the electrically erasable programmable logic device is configured as an element of a memory redundancy circuit.

33. The memory array of claim 26 wherein the electrically erasable programmable logic device is configured as an element of an electrical fuse circuit.

* * * * *